United States Patent
Kim et al.

(10) Patent No.: US 10,224,289 B2
(45) Date of Patent: Mar. 5, 2019

(54) DISPLAY DEVICE HAVING AN ALIGNMENT MARK

(71) Applicant: SAMSUNG DISPLAY CO., LTD., Yongin-si, Gyeonggi-do (KR)

(72) Inventors: Hun Kim, Seoul (KR); Sung Won Doh, Hwaseong-si (KR); Ki Seong Seo, Seoul (KR); Hwa Dong Jung, Incheon (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 162 days.

(21) Appl. No.: 15/456,983

(22) Filed: Mar. 13, 2017

(65) Prior Publication Data

US 2017/0263564 A1    Sep. 14, 2017

(30) Foreign Application Priority Data

Mar. 14, 2016   (KR) ................. 10-2016-0030277

(51) Int. Cl.
   *H01L 23/544*   (2006.01)
   *H01L 51/52*    (2006.01)
   *H01L 51/00*    (2006.01)
   *H01L 27/32*    (2006.01)

(52) U.S. Cl.
   CPC ........ *H01L 23/544* (2013.01); *H01L 51/0012* (2013.01); *H01L 27/3244* (2013.01); *H01L 51/0011* (2013.01); *H01L 2223/5442* (2013.01); *H01L 2223/54426* (2013.01); *H01L 2223/54486* (2013.01)

(58) Field of Classification Search
CPC combination set(s) only.
See application file for complete search history.

(56) References Cited

U.S. PATENT DOCUMENTS

| | | | | |
|---|---|---|---|---|
| 2011/0134075 A1* | 6/2011 | Takusa | ................ | G06F 3/044 345/174 |
| 2013/0175154 A1* | 7/2013 | Takahashi | ............ | G06F 3/044 200/600 |
| 2015/0249054 A1* | 9/2015 | Tian | .................. | H01L 23/544 257/797 |
| 2015/0316806 A1* | 11/2015 | Chang | ............. | G02F 1/133514 345/174 |
| 2015/0362770 A1* | 12/2015 | Yang | ............... | G02F 1/133512 349/42 |
| 2016/0093684 A1* | 3/2016 | Youk | ................ | H01L 27/3272 257/40 |

FOREIGN PATENT DOCUMENTS

| | | |
|---|---|---|
| KR | 100659117 | 12/2006 |
| KR | 1020100067463 | 6/2010 |
| KR | 1020140076292 | 6/2014 |
| KR | 1020140108025 | 9/2014 |
| KR | 1020150019392 | 2/2015 |

* cited by examiner

*Primary Examiner* — Mamadou Diallo
(74) *Attorney, Agent, or Firm* — F. Chau & Associates, LLC

(57) ABSTRACT

A display device according to an exemplary embodiment includes a substrate including a display area and a non-display area. An alignment mark is positioned in the non-display area. A protective layer is positioned around the alignment mark in the non-display area and separated from the alignment mark in a direction parallel to an upper surface of the substrate. A supporting member is positioned between the alignment mark and the protective layer.

20 Claims, 13 Drawing Sheets

DISPLAY DEVICE HAVING AN ALIGNMENT MARK

CROSS-REFERENCE TO RELATED APPLICATION

This application claims priority to Korean Patent Application No. 10-2016-0030277 filed in the Korean Intellectual Property Office on Mar. 14, 2016, the disclosure of which is incorporated by reference herein in its entirety.

(a) Technical Field

Exemplary embodiments of the present invention relate to a display device, and more particularly to a display device having an alignment mark.

(b) Discussion of Related Art

Display devices, such as a liquid crystal display (LCD) and an organic light emitting diode (OLED) display, may include a field generating electrode and an electro-optical active layer. As the electro-optical active layer, the organic light emitting device and the liquid crystal display may respectively include an organic emission layer and a liquid crystal layer. The field generating electrode may be connected to a switching element such as a transistor to receive a data signal, and the electro-optical active layer may convert the data signal into an optical signal to display an image.

As a substrate of the display device, a glass substrate may be used. However, glass substrates may be relatively heavy and vulnerable to breakage, and the glass substrate may be relatively rigid such that it is difficult to deform the display device into a desired shape. A display device may include a flexible substrate that is lightweight, relatively strong against an impact, and is relatively easy to deform.

Among a manufacturing process of the display device, for example, before final completion of the display device, an automatic visual inspection (AVI) step of inspecting display quality characteristics, defects, and the like of the display device may be performed. In this case, an inspection device may recognize an alignment mark formed on the substrate of the display device and a probe of the inspection device may be connected to a pad unit of the display device. However, when a recognition rate of the alignment mark decreases, the inspection step may be delayed and damage to the display device may be caused. The recognition of the alignment mark, for example, may be degraded by a bubble that may be generated in the flexible substrate near the alignment mark.

SUMMARY

According to an exemplary embodiment of the present invention, a recognition rate of an alignment mark of a display device may be increased.

A display device according to an exemplary embodiment of the present invention includes a substrate including a display area and a non-display area. An alignment mark is positioned in the non-display area. A protective layer is positioned around the alignment mark in the non-display area and separated from the alignment mark in a direction parallel to an upper surface of the substrate. A supporting member is positioned between the alignment mark and the protective layer.

The alignment mark may include a plurality of protrusions. At least part of the supporting member may be positioned in a region defined by a straight line connecting adjacent protrusions and the alignment mark.

A height of the supporting member may be in a range of from about 30% to about 100% of a height of the protection layer.

The display device may include a transistor positioned on the substrate in the display area. A protection layer may be positioned on the transistor. A pixel electrode may be positioned on the protection layer. A pixel definition layer may be positioned on the pixel electrode. The supporting member may include a layer formed of the same layer as the pixel definition layer.

The protective layer may include a layer formed of a same layer as the pixel definition layer.

The supporting member may include a first supporting layer positioned on the substrate and a second supporting layer positioned on the first supporting layer, and the second supporting layer may be formed of a same layer as the pixel definition layer.

The first supporting layer may be formed of a same layer as the protection layer.

The supporting member may further include a third supporting layer positioned on the second supporting layer.

The protection layer and the pixel definition layer may also be positioned in the non-display area, and the protective layer may include the protection layer and the pixel definition layer.

The supporting member may include a single layer.

The supporting member may include a light blocking material.

A shortest distance between the supporting member and the alignment mark may be about 50 micrometers or more.

The supporting member may have a substantially circular shape.

The supporting member may have a substantially polygonal shape.

The alignment mark may have a cross shape, and at least one of the supporting member may be positioned in each of four regions formed by the cross shape.

The supporting member may be in direct contact with the protective layer.

The display device may include a pad portion positioned in the non-display area. The protective layer does not overlap the pad portion in a thickness direction of the substrate.

According to an exemplary embodiment, bubble generation around the alignment mark is reduced or prevented in the display device, thus increasing a recognition rate of the alignment mark. Accordingly, alignment accuracy may be increased in an inspection step such as the AVI. Also, the inspection step may be prevented from being delayed by misalignment between the inspection apparatus and the display device, and the display device may be prevented from being damaged during the inspection.

BRIEF DESCRIPTION OF THE DRAWINGS

The above and other features of the invention will become more apparent by describing in detail exemplary embodiments thereof, with reference to the accompanying, in which.

DETAILED DESCRIPTION OF THE EMBODIMENTS

Figure 1:
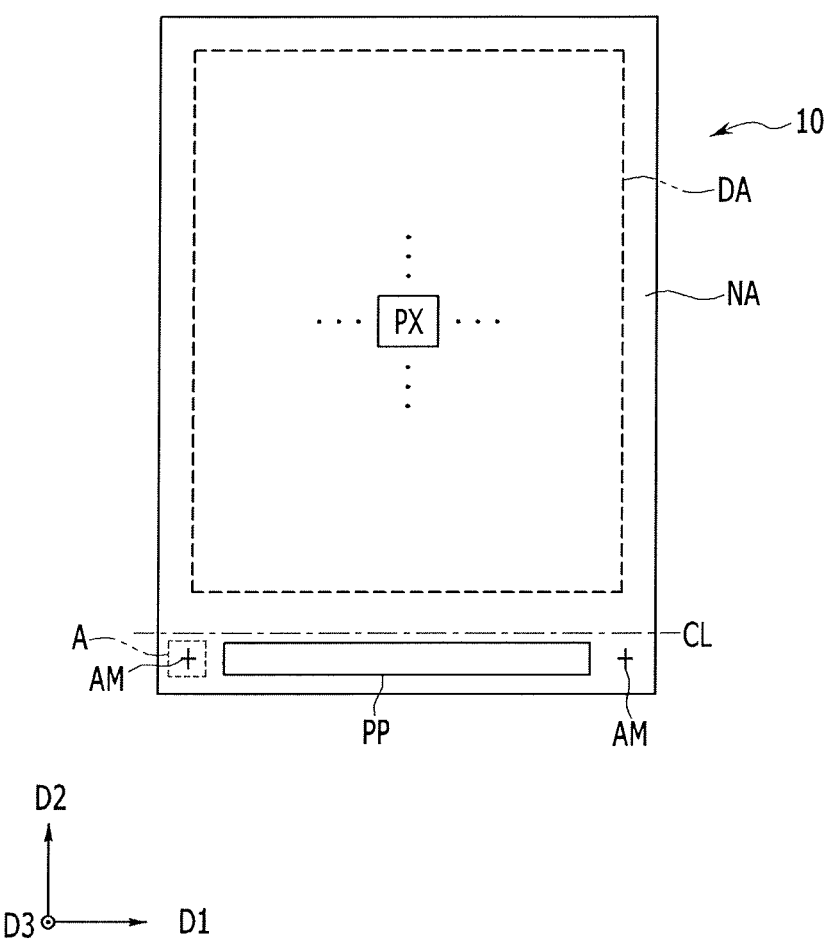
FIG. 1 is a top plan view schematically showing a display device according to an exemplary embodiment of the present invention.

Exemplary embodiments of the present invention will be described in more detail below with reference to the accompanying drawings, in which exemplary embodiments of the present invention are shown. As those skilled in the art would realize, the described embodiments may be modified in various different ways, all without departing from the spirit or scope of the present invention.

In the drawings, the thicknesses of layers, films, panels, or regions may be exaggerated for clarity. Like reference numerals may refer to like elements throughout the specification and drawings. It will be understood that when an element such as a layer, film, region, or substrate is referred to as being "on" another element, it may be directly on the other element or intervening elements may be present.

A display device according to an exemplary embodiment of the present invention will be described in more detail below with reference to accompanying drawings. As an example, an organic light emitting diode (OLED) display is described in more detail below; however, exemplary embodiments of the present invention are not limited thereto, and the exemplary embodiments described in more detail below may be similarly applicable to display devices other than OLED displays.

FIG. 1 is a top plan view schematically showing a display device according to an exemplary embodiment of the present invention.

Referring to FIG. 1, a display device according to an exemplary embodiment of the present invention may include a display panel 10. The display panel 10 may include a display area DA displaying an image, and a non-display area NA in which elements and/or wires to generate and/or transmit various signals applied to the display area are arranged and disposed around the display area DA.

In the display area DA of the display panel 10, a plurality of pixels PX are, for example, disposed in a matrix form. Signal lines such as a plurality of gate lines, a plurality of data lines and a plurality of driving voltage lines may be disposed in the display area DA. The plurality of gate lines may mainly extend substantially in a first direction D1 (e.g., a row direction), and the plurality of data lines and the plurality of driving voltage lines may mainly extend substantially in a second direction D2 (e.g., a column direction) crossing the first direction D1. Each pixel PX may be connected to a gate line, a data line, and a driving voltage line, thus each pixel may receive a gate voltage, a data voltage, and a driving voltage from the respective signal lines.

A pad portion PP may receive a signal from the outside and may be positioned in the non-display area NA of the display panel 10, and a flexible printed circuit board (FPCB) may be adhered in the pad portion PP. A driving device generating and/or processing the various signals to drive the display panel 10 may be positioned in the non-display area NA. The driving device may include a data driver and a gate driver. The data driver may be positioned in the non-display area NA. The data driver may be an integrated circuit (IC) chip. The gate driver may be positioned in the non-display area NA. The data driver and/or the gate driver may be connected to the pad portion PP in a tape carrier package (TCP) configuration in the non-display area NA. The driving device may include a signal controller controlling the data driver and the gate driver. The signal controller may include a same IC chip as the data driver or may be formed in a separate IC chip.

An alignment mark AM may be formed in the non-display area NA. The alignment mark AM may be recognizable by a sensor (e.g., a camera), for example, to correctly align a probe of an inspection device during automatic visual inspection (AVI) of the pad portion PP of the display panel 10. The alignment mark AM may be positioned near an edge of the display panel 10, for example, at both sides of the pad portion PP among the non-display area NA. The alignment mark AM may be a cross shaped (+) alignment mark AM; however, the shape of the alignment mark AM is not limited thereto. For example, the alignment mark AM may have a concave polygon shape such as a star shape. Also, the alignment mark AM may have various shapes such as a polygon, circle, an ellipse, and a character, and it may have any shape that can be recognized by the sensor of the inspection apparatus. During the automatic visual inspection, an upper protection film may be attached to the display panel. According to an exemplary embodiment of the present invention, to contact the probe of the inspection apparatus with the pad portion PP, a portion under a cutting line CL of the upper protection film may be removed.

An alignment mark of a display device according to an exemplary embodiment of the present invention will be described in more detail below.

Figure 2:
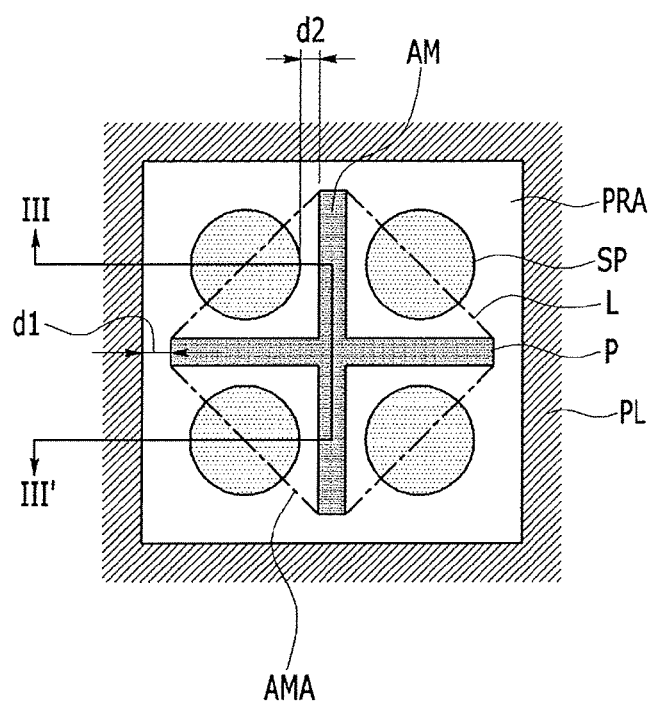
FIG. 2 is a top plan view of a region A of FIG. 1 according to an exemplary embodiment of the present invention.
Figure 3:
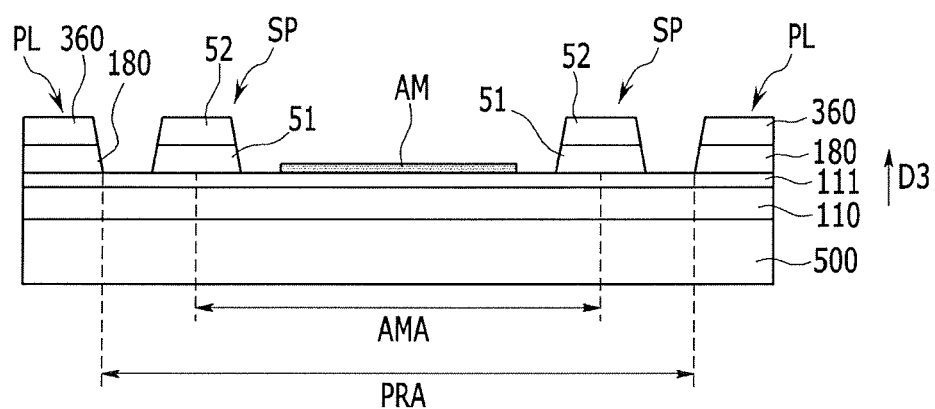
FIG. 3 is a cross-sectional view taken along a line III-III' in FIG. 2 according to an exemplary embodiment of the present invention.

FIG. 2 is a top plan view of a region A of FIG. 1 according to an exemplary embodiment of the present invention. FIG. 3 is a cross-sectional view taken along a line III-III' in FIG. 2 according to an exemplary embodiment of the present invention.

Referring to FIG. 2 and FIG. 3, a region where the alignment mark AM is formed and a peripheral area are shown. A relatively large portion of the non-display area NA of the display panel 10 may be covered by a protective layer PL to protect the various wires and elements according to an exemplary embodiment of the present invention. However, the pad portion PP might not be covered by the protective layer PL. Thus, the pad portion PP may be exposed and may be attached to the FPCB, which may transmit an external signal. The alignment mark AM is also not covered by the protective layer PL, which may increase the recognition rate by the sensor of the inspection apparatus. The protective layer PL may be removed to expose the alignment mark AM and the peripheral area thereof, and this region may be referred to as a protective layer removed area PRA herein. The alignment mark AM might not contact the protective layer PL, and may be separated from the protective layer PL by the protective layer removed area PRA. The protective layer removed area PRA may have a substantially quadrangular shape; however, exemplary embodiments of the present invention are not limited thereto. For example, the protective layer PL may have a substantially circular shape or a substantially polygonal shape. In the protective layer removed area PRA, a supporting member SP may be positioned between the protective layer PL and the alignment mark AM. One or more supporting member SP may be positioned in the protective layer removed area PRA. For example, when the alignment mark AM has the cross shape, four supporting members SP may be positioned one by one in four regions of the protective layer removed area PRA divided by the cross. The supporting member SP may prevent a substrate 110 from being raised by a step of an interval and a height between the protective layer PL and the alignment mark AM in the protective layer removed area PRA.

The protective layer PL may be separated by a first distance dl from the alignment mark AM. For example, the protective layer PL may be separated by a relatively shortest distance or more from the alignment mark AM. The supporting member SP may be separated by a second distance d2 from the alignment mark AM. For example, the supporting member SP may be separated by a relatively shortest distance from the alignment mark AM As an example, when the protective layer PL and the supporting member SP include a light blocking material, if they are too close to the alignment mark AM, the recognition rate of the alignment mark AM may be reduced. Thus, to prevent the recognition rate deterioration due to the protective layer PL and the supporting member SP, they may be spaced apart from the alignment mark AM by, for example, more than 50 micrometers. When the protective layer PL and the supporting member SP are substantially transparent (e.g., when the light blocking material is substantially omitted), the protective layer PL and the supporting member SP may be in direct contact with the alignment mark AM or may overlap the alignment mark AM without reducing the recognition rate of the alignment mark AM.

The alignment mark AM may have a substantially planar shape (e.g., a cross-sectional shape parallel to the substrate 110). As an example, if a region defined by imaginary straight lines L connecting protrusions P (e.g., ends) of the alignment mark AM is referred to as an alignment mark area AMA, a part of the supporting member SP may be positioned to overlap the alignment mark area AMA. A width of the alignment mark area AMA may be several hundred micrometers (e.g., about 500 micrometers). In the alignment mark area AMA, an area ratio of the alignment mark AM and the supporting member SP may be in a range of from about 3:7 to about 7:3, and the supporting member SP may prevent the substrate 110 from being raised in this area ratio.

Referring to FIG. 3, the alignment mark AM, the supporting member SP, and the protective layer PL may be positioned above the insulation substrate 110. A third direction D3 corresponds to a thickness direction of the display panel 110.

The substrate 110 may be a base layer supporting the various elements in the display area DA and the non-display area NA. The substrate 110 may be, for example, a flexible substrate including a polymer film. The substrate 110 may include a plastic such as polyimide, polyamide, polyethylene terephthalate, polyethylene naphthalate, polyethylene ether ketone, polycarbonate, polyethylene sulfonate, or polyarylate. The substrate 110 may have a thickness of several tens of micrometers (e.g., about 20 micrometers).

A lower protection film 500 to protect the flexible substrate may be disposed on a bottom surface of the substrate 110 (e.g., by an adhesive layer, such as a pressure sensitive adhesive (PSA) or an optically clear adhesive (OCA)). The lower protection film 500 may include a polymer film. The lower protection film 500 may include a plastic such as polyethylene terephthalate, polyethylene naphthalate, polyethylene sulfide, or polyethylene.

A buffer layer 111 may be positioned above the substrate 110. The buffer layer 111 may reduce or eliminate a penetration of moisture through the substrate 110. The buffer layer 111 may be omitted, as desired.

The alignment mark AM may be disposed on the buffer layer 111. The protective layer PL and the supporting member SP may be positioned above the alignment mark AM.

The alignment mark AM may include a light reflective material and/or an opaque material, which may be recognizable by the optical sensor (e.g., a camera). For example, of the alignment mark AM may include a metal. The alignment mark AM may be substantially simultaneously formed with and may include a same material as the gate line or the data line.

The protective layer PL may include a passivation layer 180 (e.g., a lower layer) and a pixel definition layer 360 (e.g., an upper layer). The passivation layer 180 and the pixel definition layer 360 may be layers that are sequentially positioned on a data conductor of the display area DA. The data conductor is described in more detail below with reference, for example, the FIG. 13. The passivation layer 180 and the pixel definition layer 360 may each include an organic material. The protective layer PL may have a thickness of several times to several tens of times a thickness of the alignment mark AM. For example, the alignment mark AM may have a thickness of from about 0.2 micrometers to about 0.5 micrometers, and the protective layer PL may have a thickness of from about 2 micrometers to about 5 micrometers.

The supporting member SP may include a first supporting layer 51 (e.g., a lower layer) and a second supporting layer 52 (e.g., an upper layer). The first supporting layer 51 may include a same material and may be formed from a same layer as the passivation layer 180. The second supporting layer 52 may include a same material as and may be formed from a same layer as the pixel definition layer 360. The supporting member SP may have a thickness that is approximately equal to or less than that of the protective layer PL, and for example, may have a thickness of from about 30% to about 100% of the thickness of the protective layer PL. The supporting member SP is positioned in the protective layer removed area PRA where the alignment mark AM is formed, thus preventing the substrate 110 from being raised from the protective layer removed area PRA. This will be described in more detail below with reference to FIG. 4 to FIG. 6.

Figure 4:
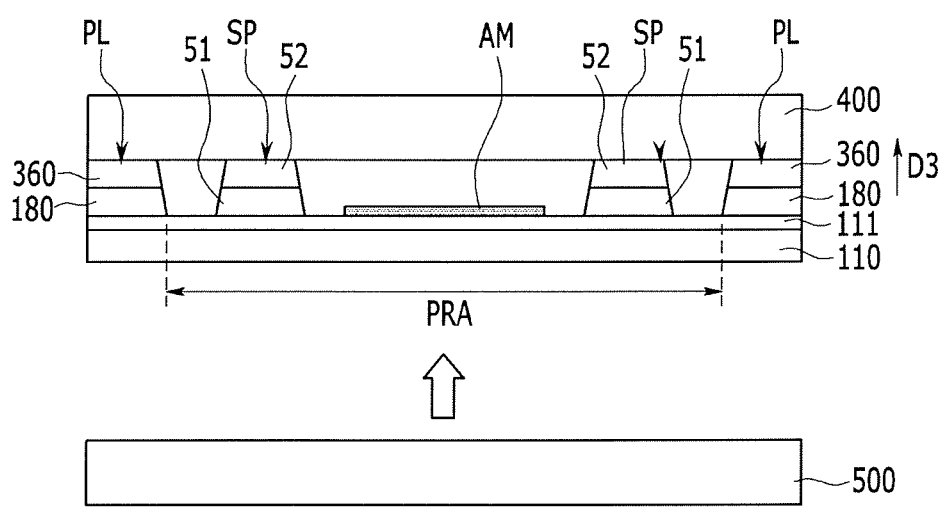
FIG. 4 is a cross-sectional view when adhering a protection film while manufacturing a display device according to an exemplary embodiment of the present invention.
Figure 5:
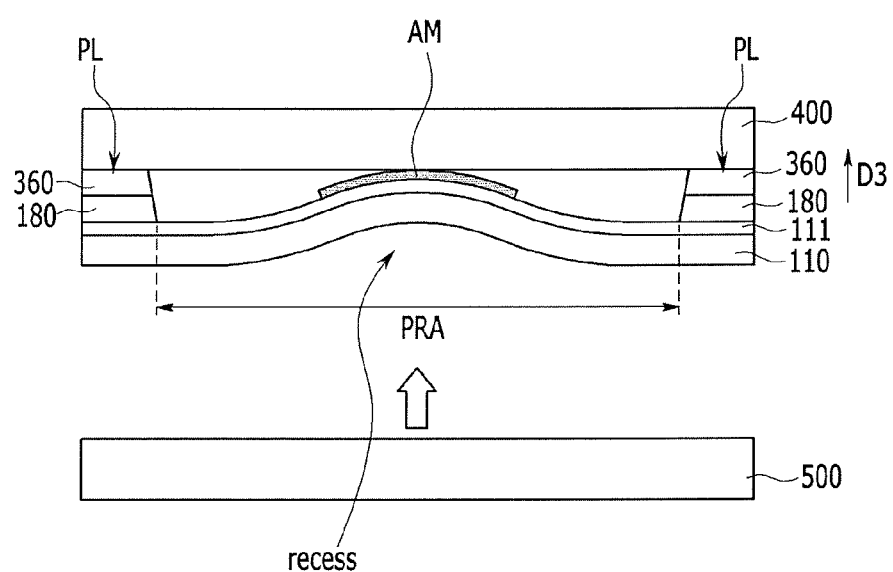
FIG. 5 is a cross-sectional view when adhering a protection film while manufacturing a display device according to a comparative example.
Figure 6:
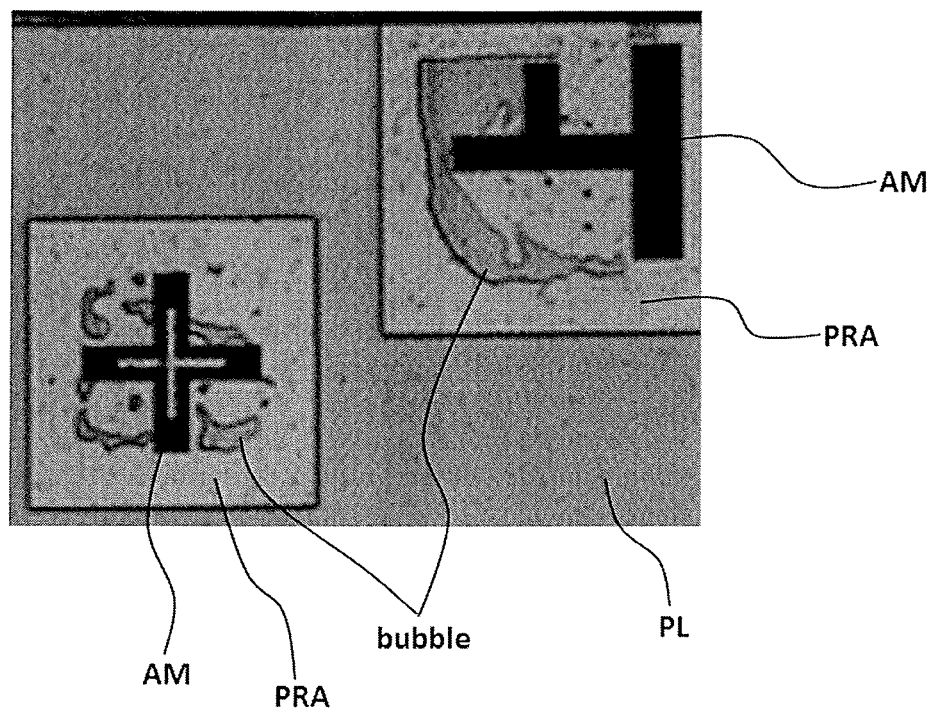
FIG. 6 illustrates a periphery of an alignment mark in a transmission mode in a display device manufactured according to FIG. 5.

FIG. 4 is a cross-sectional view when adhering a protection film while manufacturing a display device according to an exemplary embodiment of the present invention. FIG. 5 is a cross-sectional view when adhering a protection film while manufacturing a display device according to a comparative example. FIG. 6 illustrates a periphery of an alignment mark in a transmission mode in a display device manufactured according to FIG. 5.

Referring to FIG. 4, a state in which an upper protection film 400 is attached to the display panel 10 (see, e.g., FIG.

1 to FIG. 3) and then the lower protection film 500 is attached is described. Among the manufacturing process of the display panel 10, the automatic visual inspection (AVI) or a manual visual inspection for inspecting the defect existence of the display panel 10 and the display quality characteristics may be performed. In this process, an upper protection film 400 may be attached to the display panel 10 to protect an upper surface of the display panel 10. The lower protection film 500 may be attached to a lower surface of the display panel 10 (e.g., a lower surface of the substrate 110). The upper protection film 400 may be attached in the inspection process and then removed, however the lower protection film 500 may remain attached, thus forming one layer of the display panel 10.

The protective layer PL may be thicker than the supporting member SP, and thus the upper protection film 400 may be attached on the protective layer PL in the region where the alignment mark AM is formed and the peripheral area thereof. However, referring to FIG. 5, in the process of attaching the upper protection film 400, a phenomenon in which the substrate 110 is raised toward the upper protection film 400 by the step of the protective layer PL and the alignment mark AM may be generated. For example, a pressure may be slightly applied in the process of attaching the upper protection film 400, and in this case, part of the protective layer removed area PRA may be attached with the upper protection film 400. Thus, the corresponding region of the substrate 110 may be raised by a height corresponding to the thickness difference of the protective layer PL and the supporting member SP, and thus a recess may be formed at the lower surface of the substrate 110. The recess may form a space between the substrate 110 and the lower protection film 500 when attaching the lower protection film 500, and the space may be filled with air, which may form a bubble. Since the generated bubble may be trapped between the substrate 110 and the lower protection film 500, although the upper protection film 400 on the pad portion PP and the alignment mark AM is removed for the visual inspection (see, e.g., FIG. 6), the upper protection film 400 may exist around the alignment mark AM. This phenomenon may occur when the substrate 110 is relatively thin and the protective layer removed area PRA is relatively large.

The bubble around the alignment mark AM may reduce recognition of the alignment mark AM by the sensor of the inspection apparatus. Thus, among the inspection step of the display panel 10, an error may be generated such that an inspection time may be increased, and the probe and the pad portion PP may be misaligned such that the display panel 10 may be damaged. For example, when a pin of the probe contacts two pads of the pad portion PP by the misalignment or contacts an unintended pad, the elements may be damaged by a short or an overcurrent.

Referring again to FIG. 4, in the display panel 10 according to an exemplary embodiment of the present invention, the supporting member SP may be positioned in the protective layer removed area PRA. Thus, the supporting member SP may be positioned within the space defined by the substrate 110, the protective layer PL, and the upper protection film 400 when the upper protection film 400 is attached. When the upper protection film 400 is attached, the supporting member SP may separate the substrate 110 from the upper protection film 400 by a predetermined interval such that the substrate 110 might not be raised toward the upper protection film 400 in the protective layer removed area PRA. Thus, because the substrate 110 is not raised in the protective layer removed area PRA, the recess might not be generated at the lower surface of the substrate 110 such that the bubble decreasing the recognition rate of the alignment mark AM is not generated between the substrate 110 and the lower protection film 500 after attaching the lower protection film 500. The upper protection film 400 may be attached to the protective layer PL and the supporting member SP.

Referring to FIG. 3, in an exemplary embodiment of the present invention the protective layer PL and the supporting member SP may each include two layers. However, exemplary embodiments of the present invention are not limited thereto and the protective layer PL and the supporting member SP may include less or more than two layers. A stacked structure including the protective layer PL and the supporting member SP will be described in more detail below with reference to FIG. 7 and FIG. 8.

Figure 7:
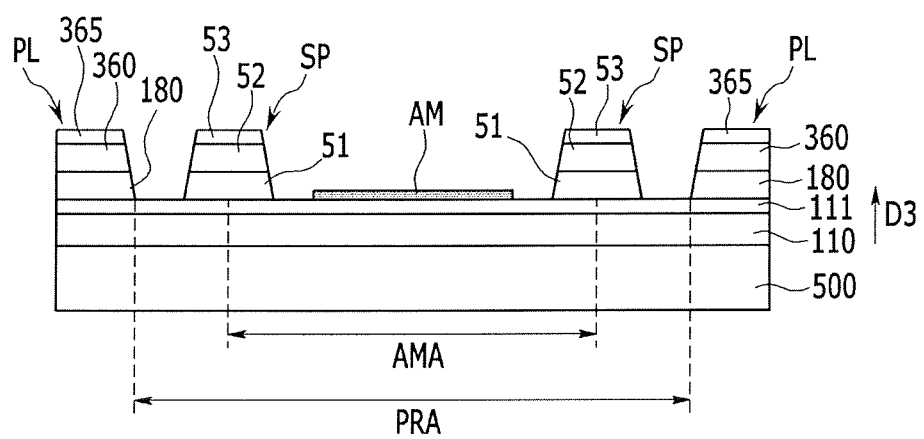
FIG. 7 and FIG. 8 are cross-sectional views taken along a line in FIG. 2 according to an exemplary embodiment of the present invention.
Figure 8:
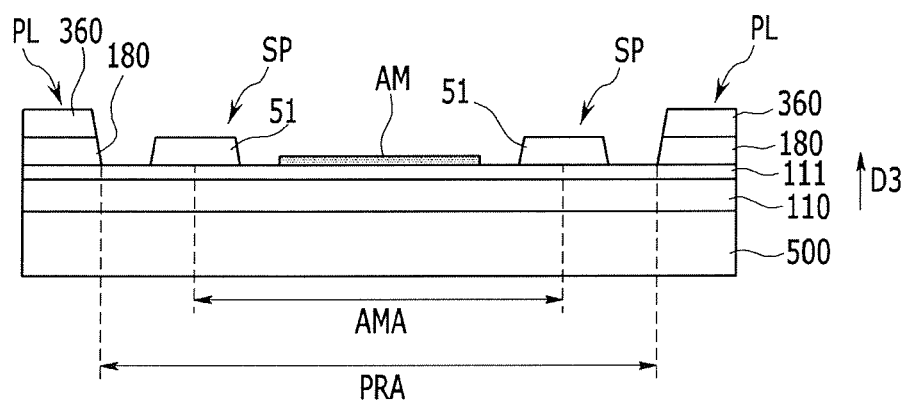

FIG. 7 and FIG. 8 are cross-sectional views taken along a line III-III' in FIG. 2 according to an exemplary embodiment of the present invention.

Referring to FIG. 7, according to an exemplary embodiment of the present invention, the protective layer PL and the supporting member SP may each include three layers. The protective layer PL may include the passivation layer 180, the pixel definition layer 360, and a spacer 365, which may be positioned above the substrate 110. The protective layer PL according to an exemplary embodiment of the present invention may include the spacer 365 on the pixel definition layer 360. For example, the spacer 365 may prevent a mask used when forming a light emission member from contacting previously formed layers in the display area DA. The supporting member SP may include the first supporting layer 51, the second supporting layer 52, and a third supporting layer 53, which may be positioned above the substrate 110. The first supporting layer 51 may be substantially simultaneously formed with and may include a same material as the passivation layer 180. The second supporting layer 52 may be substantially simultaneously formed with and may include a same material as the pixel definition layer 360. The third supporting layer 53 may be substantially simultaneously formed with and may include a same material as the spacer 365. The supporting member SP may have substantially a same thickness as the protective layer PL, and thus the substrate 110 may be supported such that the protective layer removed area PRA of the substrate 110 may be prevented from being raised toward the upper protection film when the upper protection film is attached.

Referring to FIG. 8, in an exemplary embodiment of the present invention, the protective layer PL may include two layers. The supporting member SP may have a thinner thickness than the protective layer PL. As an example, if the thickness of the supporting member SP is more than the thickness of the protective layer PL, the supporting member SP may prevent the substrate 110 from being raised. When the supporting member SP has a thinner thickness than the protective layer PL, the substrate 110 may be raised a relatively small amount. If a raised degree of the substrate 110 is relatively small, a size of the bubble generated after attaching the lower protection film may be relatively small and thus the recognition of the alignment mark AM might not be reduced. The first supporting layer 51 of the supporting member SP may be substantially simultaneously formed with and may include a same material as the passivation layer 180, or may be substantially simultaneously formed with and may include a same material as the pixel definition layer 360. According to an exemplary embodiment of the present invention, the protective layer PL and/or the supporting member SP may include more than two layer and/or more than one layer, respectively.

In an exemplary embodiment of the present invention (see, e.g., FIG. 2), the shape of the supporting member SP may be substantially circular. The supporting member SP may be separated from the protective layer PL and the alignment mark AM. Supporting members SP may be positioned on opposite sides of and spaced apart from the alignment mark AM. Some exemplary embodiments of the present invention will be described in more detail below with reference to FIG. 9 to FIG. 11.

Figure 9:
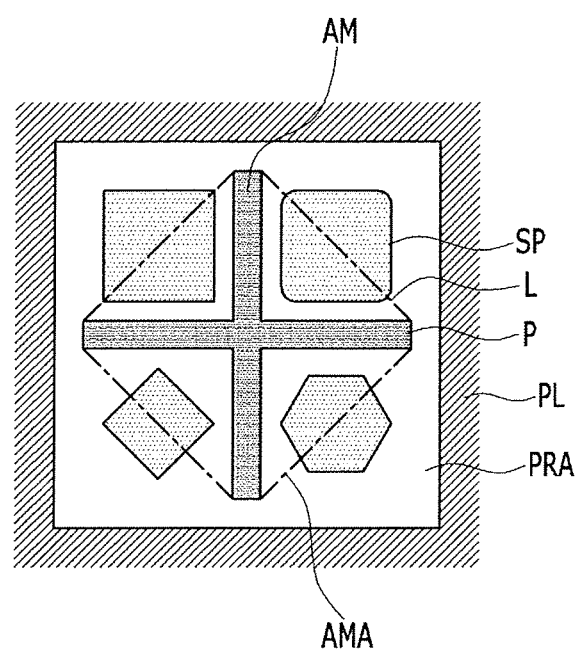
FIG. 9, FIG. 10, and FIG. 11 are top plan views of a region A in FIG. 1 according to an exemplary embodiment of the present invention.
Figure 10:
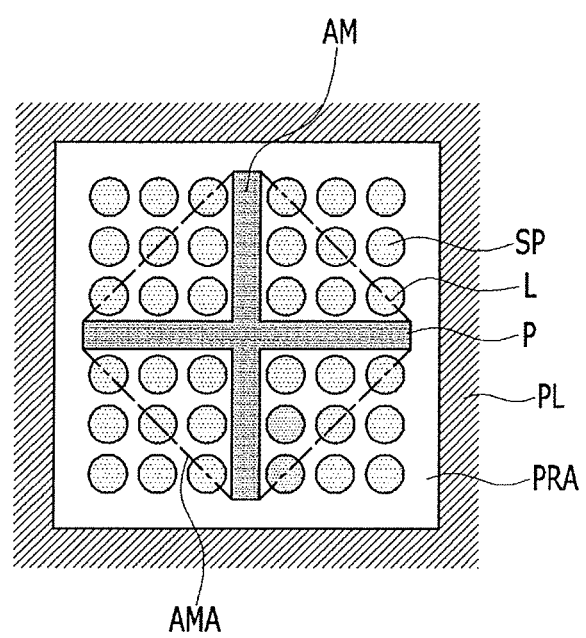
Figure 11:
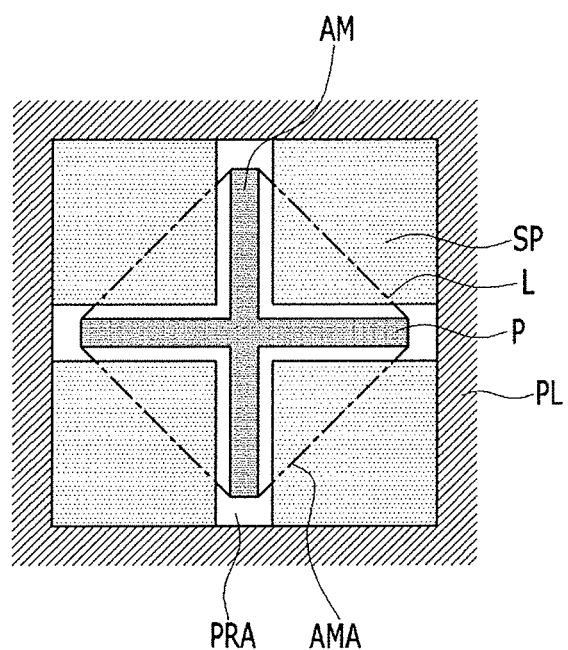

FIG. 9, FIG. 10, and FIG. 11 are top plan views of a region A in FIG. 1 according to an exemplary embodiment of the present invention.

Referring to FIG. 9, the supporting member SP may have various shapes such as a quadrangular shape in which at least one side is approximately parallel to the cross of the alignment mark AM, a quadrangular shape having a rounded vertex, a hexagonal shape, or a rhomboidal shape. As an example, the supporting members SP around one alignment mark AM may each have a same shape as each other. Alternatively, at least one supporting member SP of a plurality of supporting members may have a different shape from the other supporting members SP of the plurality of supporting members.

Referring to FIG. 10, a plurality of supporting members SP may be positioned in each region divided by the cross of the alignment mark AM. Thus, a size (e.g., a width) of one supporting member SP may be smaller than another of the supporting members SP. As an example, the shapes of the supporting members SP may all be the same, or at least some shapes of some supporting members may be different from each other.

Referring to FIG. 11, while the supporting member SP may be positioned between the protective layer PL and the alignment mark AM in the protective layer removed area PRA, the supporting member SP may be separated from the alignment mark AM while being in direct contact with the protective layer PL. In the protective layer removed area PRA, the supporting member SP might not be formed around the alignment mark AM. One supporting member SP may be respectively positioned for each region divided by the cross of the alignment mark AM, and thus four supporting members SP may be separated from each other. Alternatively, adjacent supporting members SP may be connected between the protrusion P of the alignment mark AM and the protective layer PL.

A pixel positioned in the display area DA of the display device according to an exemplary embodiment of the present invention will be described in more detail below with reference to FIGS. 12 and 13.

Figure 12:
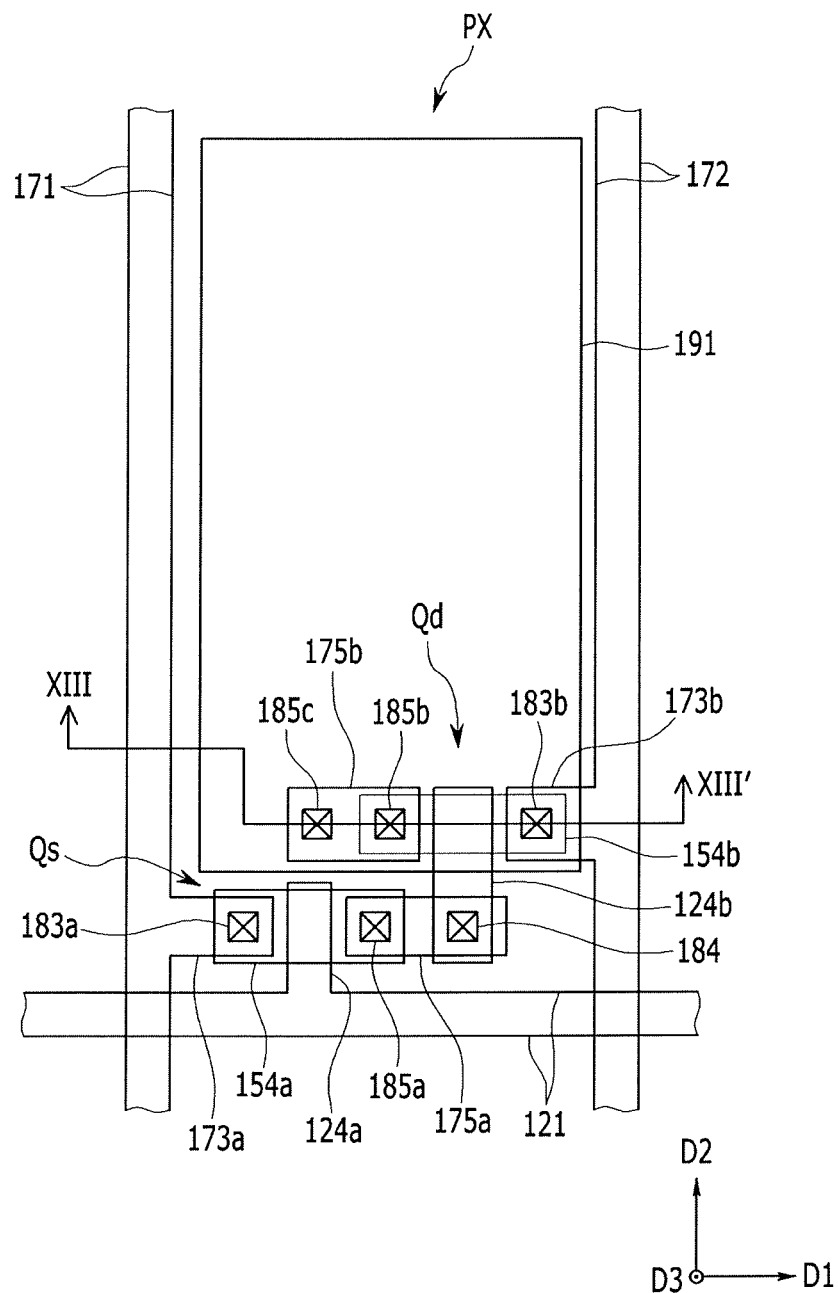
FIG. 12 is a layout view of one pixel area of a display device according to an exemplary embodiment of the present invention.

FIG. 12 is a layout view of one pixel area of a display device according to an exemplary embodiment of the present invention. FIG. 13 is a cross-sectional view taken along a line XIII-XIII' in FIG. 12 according to an exemplary embodiment of the present invention.

Figure 13:
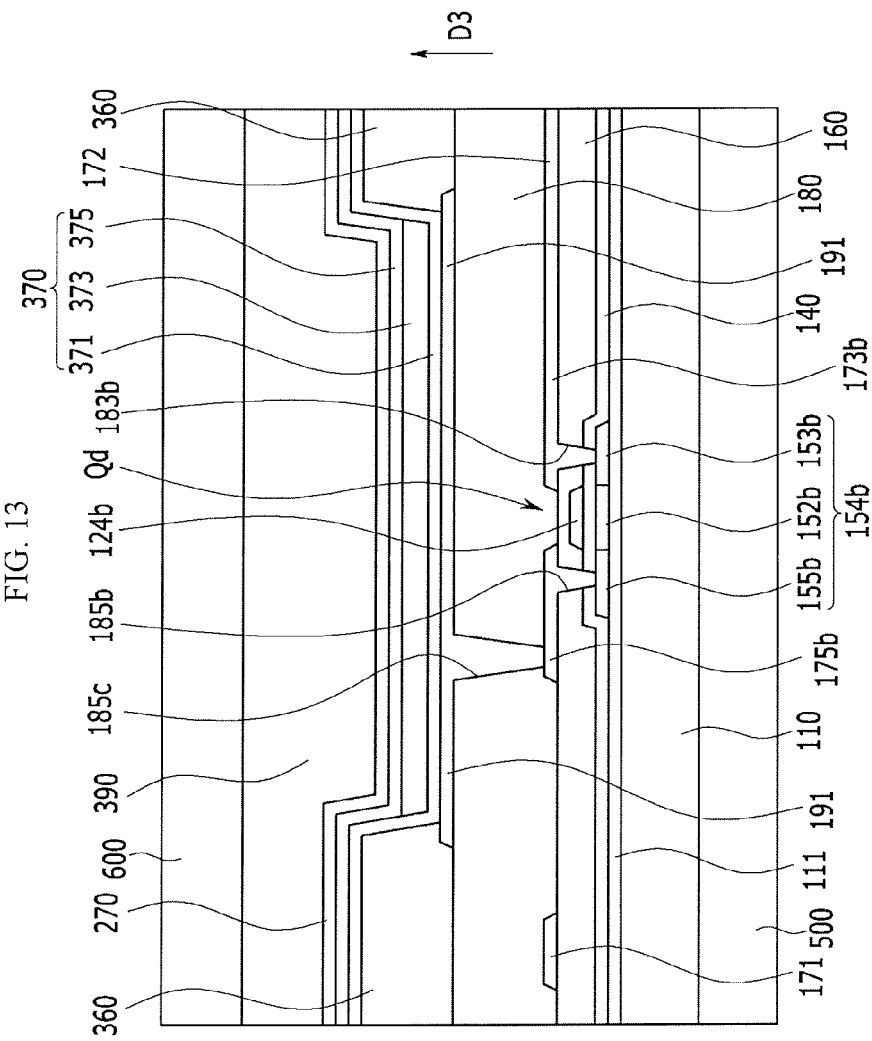
FIG. 13 is a cross-sectional view taken along a line XIII-XIII' in FIG. 12 according to an exemplary embodiment of the present invention.

Referring to FIG. 12 and FIG. 13, the display device may include a plurality of signal lines 121, 171, and 172, and a plurality of pixels PX. Each of the pixels PX may be connected to at least one of the plurality of signal lines 121, 171, and 172. The signal lines may include a plurality of gate lines 121 transmitting gate signals, a plurality of data lines 171 transmitting data signals, and a plurality of driving voltage lines 172 transmitting driving voltages. Each pixel PX may include a switching transistor Qs, a driving transistor Qd, a storage capacitor, and a light-emitting device including a light emission member 370.

The display device may include an insulation substrate 110 and a plurality of layers formed thereon. The substrate 110 may be a flexible substrate including a polymer film. The lower protection film 500 may include polyethylene terephthalate (PET) and may be attached to the lower surface of the substrate 110.

The buffer layer 111 may reduce or prevent an occurrence of degradation of a semiconductor characteristic due to impurities entering the display panel. For example, a penetration of moisture or impurities into the display panel may reduce or eliminated. The buffer layer 111 may be formed directly on the substrate 110. The substrate 110 may be include a plurality of layers. The buffer layer 111 may be positioned between the plurality of layers of the substrate 110. For example, the substrate 110 may have a structure in which the polymer film and the buffer layer are alternately stacked.

A first semiconductor 154a and a second semiconductor 154b may be positioned on the buffer layer 111. The first semiconductor 154a may be positioned in a channel region and at opposite sides of the channel region, and may include a source region and a drain region that are doped. The second semiconductor 154b may be positioned in a channel region 152b and at opposite sides of the channel region 152b, and may include a source region 153b and a drain region 155b that are doped. The first semiconductor 154a and the second semiconductor 154b may each include polysilicon. The first semiconductor 154a and the second semiconductor 154b may each include an oxide semiconductor or amorphous silicon.

A gate insulating layer 140 including an inorganic material such as a silicon oxide, or a silicon nitride may be disposed on the first semiconductor 154a and the second semiconductor 154b. The gate insulating layer 140 may be a single layer or multiple layers.

A gate conductor including a gate line 121, a first gate electrode 124a, and a second gate electrode 124b may be positioned on the gate insulating layer 140. The gate conductor may include a metal such as copper (Cu), aluminum (Al), silver (Ag), molybdenum (Mo), chromium (Cr), tantalum (Ta), titanium (Ti), or metal alloys thereof. The first gate electrode 124a may overlap the channel region of the first semiconductor 154a, and the second gate electrode 124b may overlap the channel region 152b of the second semiconductor 154b.

An interlayer insulating layer 160 may be positioned on the gate insulating layer 140 and the gate conductor. The interlayer insulating layer 160 and the gate insulating layer 140 may include a contact hole 183a overlapping the source region of the first semiconductor 154a, a contact hole 185a overlapping the drain region, a contact hole 183b overlapping the source region 153b of the second semiconductor 154b, and a contact hole 185b overlapping the drain region 155b.

A data conductor including a data line 171, a driving voltage line 172, a first source electrode 173a, a second source electrode 173b, a first drain electrode 175a, and a second drain electrode 175b may be positioned on the interlayer insulating layer 160. The data conductor, for example, may include a metal such as copper (Cu), aluminum (Al), silver (Ag), molybdenum (Mo), chromium (Cr), gold (Au), platinum (Pt), palladium (Pd), tantalum (Ta), tungsten (W), titanium (Ti), nickel (Ni), or metal alloys thereof. The first source electrode 173a and the first drain electrode 175a may be connected to the source region and the drain region of the first semiconductor 154a through the contact holes 183a and 185a, respectively. The first drain electrode 175a may be connected to the second gate electrode 124b through a contact hole 184. The second source electrode 173b and the second drain electrode 175b may be connected to the source region 153b and the drain region 155b of the second semiconductor 154b through the contact holes 183b and 185b, respectively.

The first gate electrode 124a, the first source electrode 173a, and the first drain electrode 175a may form a switching transistor Qs together with the first semiconductor 154a. The second gate electrode 124b, the second source electrode 173b, and the second drain electrode 175b may form a driving transistor Qd together with the second semiconductor 154b. Exemplary configurations of the transistors Qs and Qd are described herein; however, exemplary embodiments of the present invention are not limited thereto, and the transistors Qs and Qd may have various configurations, as desired.

The passivation layer 180 may be positioned on the data conductor. The passivation layer 180 may have a substantially flat surface to increase the light emission efficiency of the organic light emitting element to be formed thereon. The passivation layer 180 may include an organic material. The passivation layer 180 may have a contact hole 185c overlapping the second drain electrode 175b. Referring to FIG. 3, FIG. 7, and FIG. 8, the passivation layer 180 may form one layer of the protective layer PL in the non-display area NA. The first supporting layer 51 of the supporting member SP may be substantially simultaneously formed and may include a same material as the passivation layer 180.

A first electrode 191, which may be a pixel electrode or an anode, may be positioned on the passivation layer 180. The first electrode 191 of each pixel may be connected to the second drain electrode 175b through the contact hole 185c of the passivation layer 180. The first electrode 191 may include a reflective conductive material or a semi-transmittable conductive material, or may include a transparent conductive material. The first electrode 191 may be a single layer or multiple layers.

The pixel definition layer 360 having a plurality of openings overlapping the first electrode 191 may be positioned on the passivation layer 180. The opening of the pixel definition layer 360 overlapping the first electrode 191 may define each pixel area. The pixel definition layer 360 may include an organic material. To increase a contrast ratio of the image displayed by the display panel, the pixel definition layer 360 may include a light blocking material. Referring to FIG. 3, FIG. 7, and FIG. 8, the pixel definition layer 360 may form one layer of the protective layer PL in the non-display area NA and may be positioned on the passivation layer 180 of the protective layer PL. Referring to FIG. 3 and FIG. 7, the second supporting layer 52 of the supporting member SP may be substantially simultaneously formed with and may include a same material as the pixel definition layer 360. Referring to FIG. 8, the first supporting layer 51 of the supporting member SP may be substantially simultaneously formed with and may include a same material as the pixel definition layer 360.

A spacer may be positioned on the pixel definition layer 360. The spacer may include an organic material and may prevent a mask used in a following process (e.g., a formation process of the light emission member 370) from coming into contact with the first electrode 191. Referring to FIG. 7, the spacer 365 may form one layer of the protective layer PL in the non-display area NA and may be positioned on the pixel definition layer 360. The third supporting layer 53 of the supporting member SP may be substantially simultaneously formed with and may include a same material as the spacer 365.

The light emission member 370 may be positioned on the first electrode 191 defined on the pixel definition layer 360. The light emitting member 370 may include a first organic common layer 371, a light emission layer 373, and a second organic common layer 375 that are sequentially stacked.

The first organic common layer 371 may include at least one of a hole injection layer and a hole transporting layer. When both of the hole injecting layer and the hole transporting layer are included, the hole injecting layer and the hole transporting layer may be sequentially stacked. The first organic common layer 371 may be formed throughout substantially the entire surface of the display area in which the pixels are disposed. Alternatively, the first organic common layer 371 may be formed only in the respective pixel areas.

Each light emission layer 373 may be positioned on the first electrode 191 of each corresponding pixel. The light emission layer 373 may include an organic material for intrinsically displaying light of primary colors such as red, green, and blue, and may have a structure in which a plurality of organic material layers for displaying light of different colors are stacked. According to an exemplary embodiment of the present invention, the light emission layer 373 may include a white emission layer representing white. The part of the light emission layer 373 may be positioned to overlap the driving transistor Qd.

The second organic common layer 375 may include, for example, at least one of an electron transporting layer and an electron injecting layer, and when both of the electron transporting layer and the electron injecting layer are included, the electron transporting layer and the electron injecting layer may be sequentially stacked.

A second electrode 270, which may be a common electrode or a cathode, may be formed on the light emission member 370. The common electrode 270 may include a transparent conductive material such as ITO or IZO. The common electrode 270 may be formed by thinly stacking a metal such as calcium (Ca), barium (Ba), magnesium (Mg), aluminum (Al), or silver (Ag), to have light permeability. The first electrode 191, the light emission member 370, and the second electrode 270 of each pixel may form a light-emitting device.

An encapsulation layer 390 may be positioned on the second electrode 270. The encapsulation layer 390 may substantially encapsulate the light emission member 370 and the second electrode 270 to reduce or prevent a permeation of external moisture or oxygen. The encapsulation layer 390 may include at least one inorganic layer and at least one organic layer, and the inorganic layer and the organic layer may be alternately stacked.

A polarization layer 600 may be positioned on the encapsulation layer 390. The polarization layer 600 may reduce external light reflection to increase a contrast ratio and visibility.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. A display device comprising:
a substrate including a display area and a non-display area;
an alignment mark positioned in the non-display area;

a protective layer positioned around the alignment mark in the non-display area and separated from the alignment mark in a direction parallel to an upper surface of the substrate; and a supporting member positioned between the alignment mark and the protective layer.

2. The display device of claim 1, wherein
the alignment mark includes a plurality of protrusions, and
at least part of the supporting member is positioned in a region defined by a straight line connecting adjacent protrusions and the alignment mark.

3. The display device of claim 1, wherein
a height of the supporting member is in a range of from about 30% to about 100% of a height of the protection layer.

4. The display device of claim 1, further comprising:
a transistor positioned on the substrate in the display area;
a protection layer positioned on the transistor;
a pixel electrode positioned on the protection layer; and
a pixel definition layer positioned on the pixel electrode,
wherein the supporting member includes a layer formed of a same layer as the pixel definition layer.

5. The display device of claim 4, wherein
the protective layer includes a layer formed of a same layer as the pixel definition layer.

6. The display device of claim 4, wherein
the supporting member includes a first supporting layer positioned on the substrate and a second supporting layer positioned on the first supporting layer, and
the second supporting layer is formed of a same layer as the pixel definition layer.

7. The display device of claim 6, wherein
the first supporting layer is formed of a same layer as the protection layer.

8. The display device of claim 6, wherein
the supporting member further includes a third supporting layer positioned on the second supporting layer.

9. The display device of claim 4, wherein
the protection layer and the pixel definition layer are also positioned in the non-display area, and
the protective layer includes the protection layer and the pixel definition layer.

10. The display device of claim 4, wherein
the supporting member includes a single layer.

11. The display device of claim 1, wherein
the supporting member includes a light blocking material.

12. The display device of claim 1, wherein
a shortest distance between the supporting member and the alignment mark is about 50 micrometers or more.

13. The display device of claim 1, wherein
the supporting member has a substantially circular shape.

14. The display device of claim 1, wherein
the supporting member has a substantially polygonal shape.

15. The display device of claim 1, wherein
the alignment mark has a cross shape, and at least one supporting member is positioned in each of four regions formed by the cross shape.

16. The display device of claim 1, wherein
the supporting member is in direct contact with the protective layer.

17. The display device of claim 1, further comprising
a pad portion positioned in the non-display area,
wherein the protective layer does not overlap the pad portion in a thickness direction of the substrate.

18. A display device, comprising:
a substrate;
a buffer layer disposed on the substrate;
an alignment mark disposed on the buffer layer;
supporting members disposed on opposite sides of the alignment mark and spaced apart from the alignment mark; and
protective layers disposed on opposite sides of the alignment mark and spaced apart from the alignment mark by a greater distance than the supporting members are spaced apart from the alignment mark.

19. The display device of claim 18, wherein each of the supporting members has substantially a same height as each of the protective layers.

20. The display device of claim 19, wherein each of the supporting members and each of the protective layers comprises at least two layers.

* * * * *